(12) United States Patent
Hiraoka et al.

(10) Patent No.: US 11,523,493 B2
(45) Date of Patent: Dec. 6, 2022

(54) ELECTRONIC CONTROL UNIT

(71) Applicant: Hitachi Automotive Systems, Ltd., Hitachinaka (JP)

(72) Inventors: Miki Hiraoka, Tokyo (JP); Ryosuke Ishida, Hitachinaka (JP); Yoshio Kawai, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 24 days.

(21) Appl. No.: 17/268,849

(22) PCT Filed: Jun. 27, 2019

(86) PCT No.: PCT/JP2019/025600
§ 371 (c)(1),
(2) Date: Feb. 16, 2021

(87) PCT Pub. No.: WO2020/059239
PCT Pub. Date: Mar. 26, 2020

(65) Prior Publication Data
US 2021/0195728 A1 Jun. 24, 2021

(30) Foreign Application Priority Data

Sep. 20, 2018 (JP) ................................ JP2018-176199

(51) Int. Cl.
*H05K 1/18* (2006.01)
*H05K 1/02* (2006.01)
(52) U.S. Cl.
CPC ........... *H05K 1/0206* (2013.01); *H05K 1/185* (2013.01)
(58) Field of Classification Search
CPC .............................. H05K 1/0206; H05K 1/185
See application file for complete search history.

(56) References Cited

U.S. PATENT DOCUMENTS 6,629,366 B1 * 10/2003 Kobayashi ........... H05K 3/4682
29/830
2005/0183882 A1 8/2005 Yun et al.
(Continued)

FOREIGN PATENT DOCUMENTS

JP 2005-93905 A 4/2005
JP 2005-244199 A 9/2005
(Continued)

OTHER PUBLICATIONS

International Search Report (PCT/ISA/210) issued in PCT Application No. PCT/JP2019/025600 dated Sep. 17, 2019 with English translation (four (4) pages).
(Continued)

*Primary Examiner* — Binh B Tran
(74) *Attorney, Agent, or Firm* — Crowell & Moring LLP

(57) ABSTRACT

An electronic control unit includes: a wiring substrate having a first surface on which a conductor wire is formed; a first electronic component that is implemented on the first surface of the wiring substrate, and has a large heat generation amount; a second electronic component that is implemented on the first surface of the wiring substrate, and has a heat generation amount smaller than the first electronic component; and a resin that covers the first electronic component, the second electronic component, and the first surface of the wiring substrate, and a second surface of the wiring substrate that is opposite to the first surface. A distance between an outer surface of the resin immediately below the first electronic component, and the second surface of the wiring substrate is longer than a distance between an outer surface of the resin immediately above the second electronic component, and the first surface of the wiring substrate.

11 Claims, 9 Drawing Sheets

(56) References Cited

U.S. PATENT DOCUMENTS

| | | | |
|---|---|---|---|
| 2006/0134937 A1* | 6/2006 | Mayuzumi | H05K 3/284 439/61 |
| 2006/0272150 A1 | 12/2006 | Eguchi et al. | |
| 2010/0302746 A1* | 12/2010 | Wing | H05K 1/182 29/829 |
| 2015/0062825 A1* | 3/2015 | Ossimitz | H01L 21/4882 29/841 |
| 2015/0319840 A1 | 11/2015 | Sanada et al. | |
| 2019/0043802 A1* | 2/2019 | Kapusta | H01L 21/4857 |

FOREIGN PATENT DOCUMENTS

| | | |
|---|---|---|
| JP | 2006-173402 A | 6/2006 |
| JP | 2009-147014 A | 7/2009 |
| JP | 2013-69832 A | 4/2013 |
| JP | 2014-131081 A | 7/2014 |
| JP | 2018-22764 A | 2/2018 |
| WO | WO 2005/004563 A1 | 1/2005 |

OTHER PUBLICATIONS

Japanese-language Written Opinion (PCT/ISA/237) issued in PCT Application No. PCT/JP2019/025600 dated Sep. 17, 2019 (five (5) pages).

\* cited by examiner

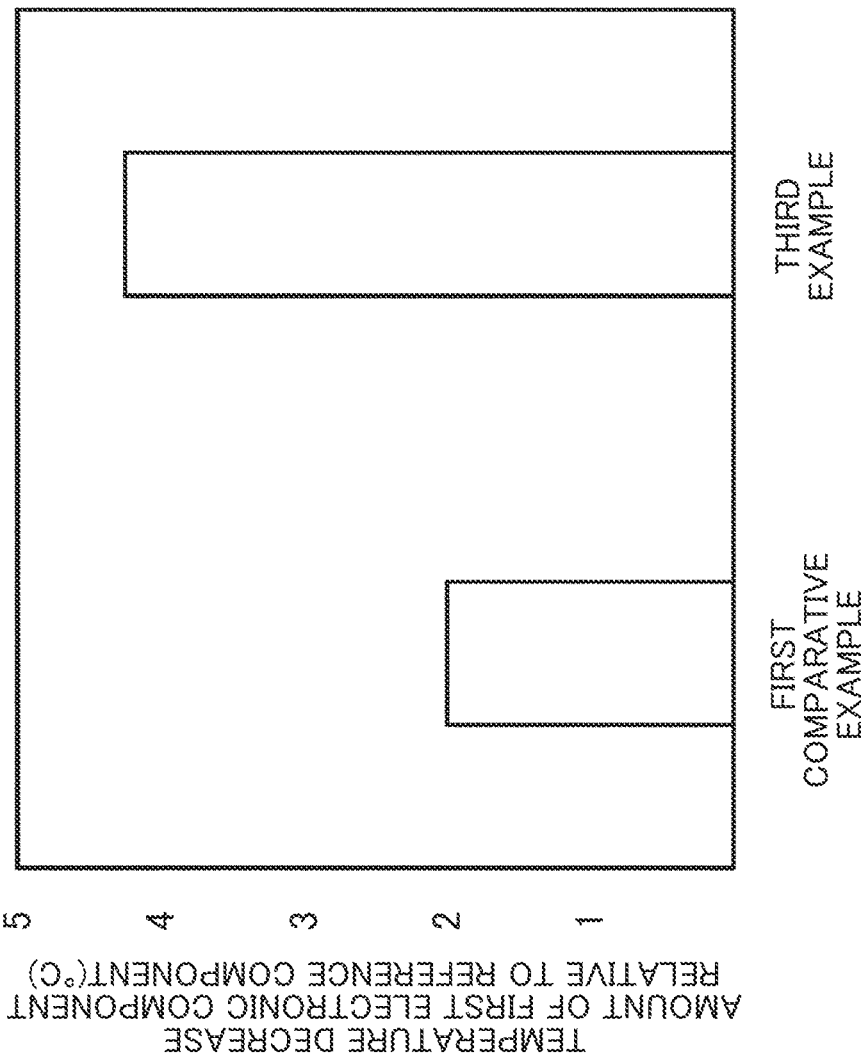

ELECTRONIC CONTROL UNIT

TECHNICAL FIELD

The present invention relates to an electronic control unit.

BACKGROUND ART

In recent years, for improvement of fuel efficiency, and highly precise control of automobiles, and construction machines, integration of mechanical components and electronic components that are directly mounted on actuators such as engines is demanded about electronic control units. Because the mounting location of an electronic control unit is limited in the case of mechanical/electric integration, size reduction becomes necessary, and along with size reduction, heat generation density of the electronic components increase, giving rise to necessity for high heat dissipation.

As electronic control units that can be applied to such uses, there is a known structure in which electronic components are implemented on a wiring substrate having a plurality of wiring layers and through-holes, and are supported by a metallic base, and the metallic base and the wiring substrate are sealed in by a thermosetting resin. It is described that, in this structure, the insides of the through-holes are also filled with the resin, the durability of the through-holes against heat stress improves thereby, and it is possible to attempt to increase the lifetime (see Patent Literature 1, for example).

CITATION LIST

Patent Literature

Patent Literature 1: JP-2009-147014-A

SUMMARY OF INVENTION

Technical Problem

In Patent Literature 1 described above, there are no descriptions about a structure of the sealing resin for improving the heat dissipation property of the electronic components.

Solution to Problem

An electronic control unit according to one aspect of the present invention is an electronic control unit including: a wiring substrate having a first surface on which a conductor wire is formed; a first electronic component that is implemented on the first surface of the wiring substrate, and has a large heat generation amount; a second electronic component that is implemented on the first surface of the wiring substrate, and has a heat generation amount smaller than the first electronic component; and a resin that covers the first electronic component, the second electronic component, and the first surface of the wiring substrate, and a second surface of the wiring substrate that is opposite to the first surface. A distance between an outer surface of the resin immediately below the first electronic component, and the second surface of the wiring substrate is longer than a distance between an outer surface of the resin immediately above the second electronic component, and the first surface of the wiring substrate.

Advantageous Effects of Invention

The present invention enables improvement of the heat dissipation property of electronic components.

BRIEF DESCRIPTION OF DRAWINGS

FIG. 9 is a figure illustrating a temperature decrease amount temperature decrease amount of the first electronic component according to the first comparative example, and the third example relative to the reference component.

DESCRIPTION OF EMBODIMENTS

Figure 1:
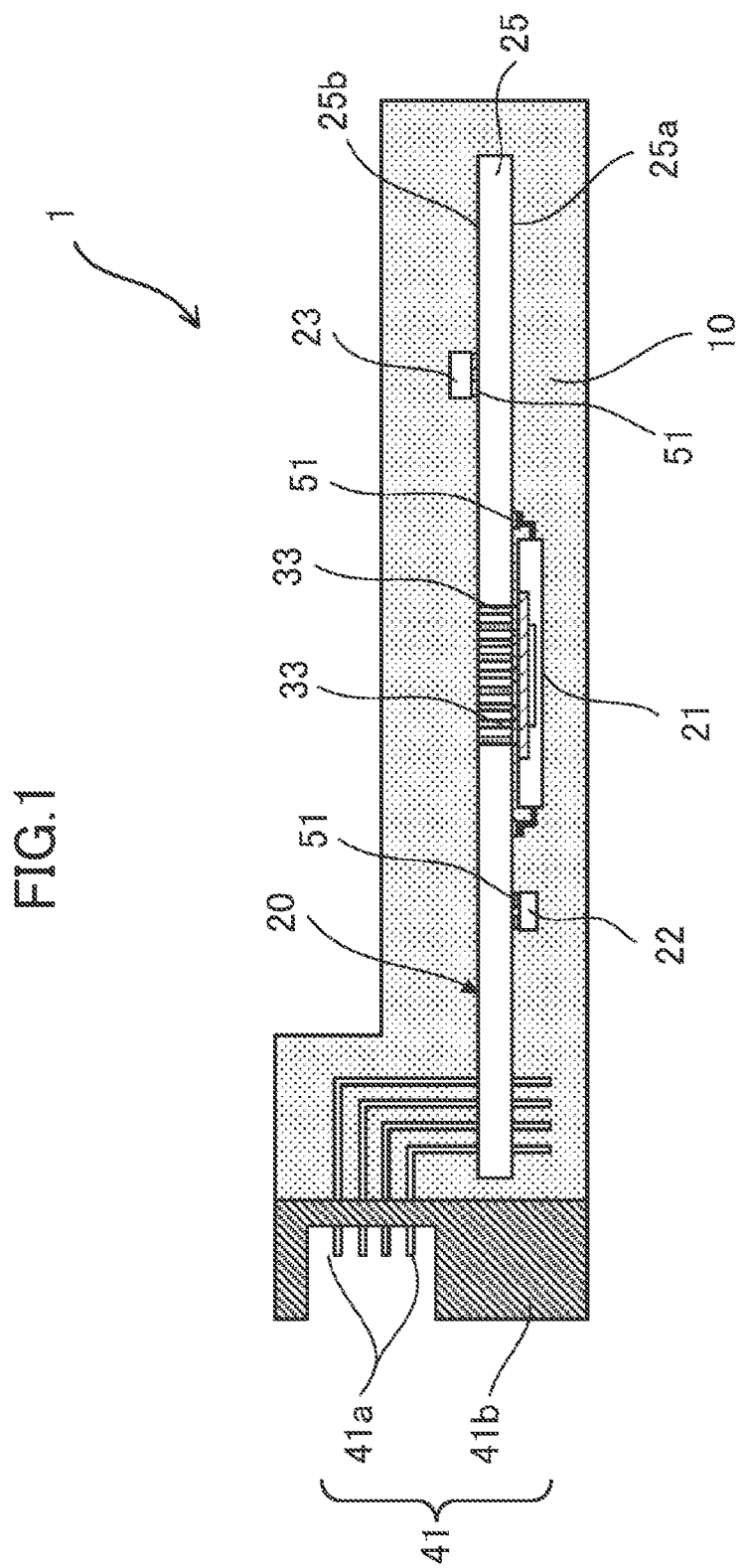
FIG. 1 is a cross-sectional view of a first embodiment of an electronic control unit according to the present invention.

In the following, embodiments of the present invention are explained with reference to the drawings. The following description, and the drawings illustrate examples for explaining the present invention, and there are omissions and simplification as appropriate for clarification of the explanation. The present invention can be implemented also in various other forms. Unless there is a particular limitation, the number of each constituent element may be one or greater than one.

The position size, shape, range, and the like of each constituent element illustrated in the drawings do not represent the actual position, size, shape, range, and the like in some cases, for facilitating the understanding about the invention. Because of this, the present invention is not necessarily limited by the position, size, shape, range, and the like disclosed in the drawings.

In a case that there are a plurality of constituent elements having identical or similar functions, they are explained by being given different suffixes to identical reference signs in some cases. It should be noted however that, in a case that it is not necessary to distinguish between the plurality of those constituent elements, they are explained without the suffixes in some cases.

First Embodiment

A first embodiment of an electronic control unit of the present invention is explained with reference to FIG. 1 to FIG. 3.

FIG. 1 is a cross-sectional view of the first embodiment of the electronic control unit according to the present invention.

An electronic control unit 1 includes an electronic component constituent body 20; and a resin 10 that seals the entire surface of the electronic component constituent body 20.

The electronic component constituent body 20 includes a wiring substrate 25, a first electronic component 21, a second electronic component 22, a third electronic component 23, and a connector 41.

For example, the wiring substrate 25 is formed of a glass epoxy resin or the like, and has front surfaces which are a first surface 25a, and a second surface 25b. The first surface 25a, and the second surface 25b have conductor wires 26a and 26b (not illustrated FIG. 1, and FIG. 2; see FIG. 3) formed thereon, respectively.

The first electronic component 21 is an electronic component having a large heat generation amount such as an ASIC (Application Specific Integrated Circuit), for example. The second and third electronic components 22 and 23 are electronic components having heat generation amounts smaller than that of the first electronic component 21, such as active elements or passive elements.

The first electronic component 21, and the second electronic component 22 are electrically connected to the conductor wire 26a of the first surface 25a on the wiring substrate 25 by an electrically conductive material 51. The third electronic component 23 is electrically connected to the conductor wire 26b on the second surface 25b of the wiring substrate 25 by the electrically conductive material 51. The electrically conductive material 51 is formed of a solder not containing lead such as Sn—Ag—Cu, or an electrically conductive resin such as a silver paste.

A plurality of vias 33 are formed in an area of the wiring substrate 25 that faces the first electronic component 21. The vias 33 are formed by forming plated films on the inner surfaces of through-holes that penetrate the wiring substrate 25 in the thickness direction, or by filling such through-holes with an electrically conductive material. The vias 33 couple the conductor wires 26a and 26b of the wiring substrate 25 such that heat can be transferred therethrough. Stated differently, the vias 33 thermally couple the conductor wires 26a and 26b of the wiring substrate 25.

The connector 41 includes a plurality of connector terminals 41a, and a housing section 41b that integrally fixes the connector terminals 41a by insert-molding, engagement or the like. The housing section 41b is formed of polybutylene terephthalate (PBT), polyphenylenesulfide (PPS) or the like, for example. Each connector terminal 41a of the connector 41 is inserted into a through-hole (not illustrated) of the wiring substrate 25, and connected to the conductor wires 26a and 26b of the wiring substrate 25 by a joint material such as a solder which is not illustrated.

The resin 10 covers the first electronic component 21, the second and third electronic components 22 and 23, the wiring substrate 25, and a portion between the wiring substrate 25 and the housing section 41b which portion is part of the connector terminals 41a such that the resin 10 seals them in from the outside of it. Thereby, the reliability of the electronic control unit 1 in terms of the heat-resisting property, waterproof property, salt water resistance property and the like is ensured. The resin 10 reduces thermal strains of the first electronic component 21, the second and third electronic components 22 and 23, and the electrically conductive material 51 connecting the connector terminals 41a and the wiring substrate 25, and the reliability in terms of the temperature cycle property, and the like is ensured. In addition, the resin 10 significantly influences the heat dissipation property about heat generated from the first electronic component 21 and the like. The present invention is configured to improve the heat dissipation property of the first electronic component 21 by using the heat dissipation effect attained by the resin 10 as mentioned below. The material of the resin 10 is suitably a thermosetting resin such as an epoxy-based resin, a phenol-based resin, a urethan-based resin or an unsaturated polyester, for example. However, these resin materials are examples, and other resin materials may be used.

Figure 2:
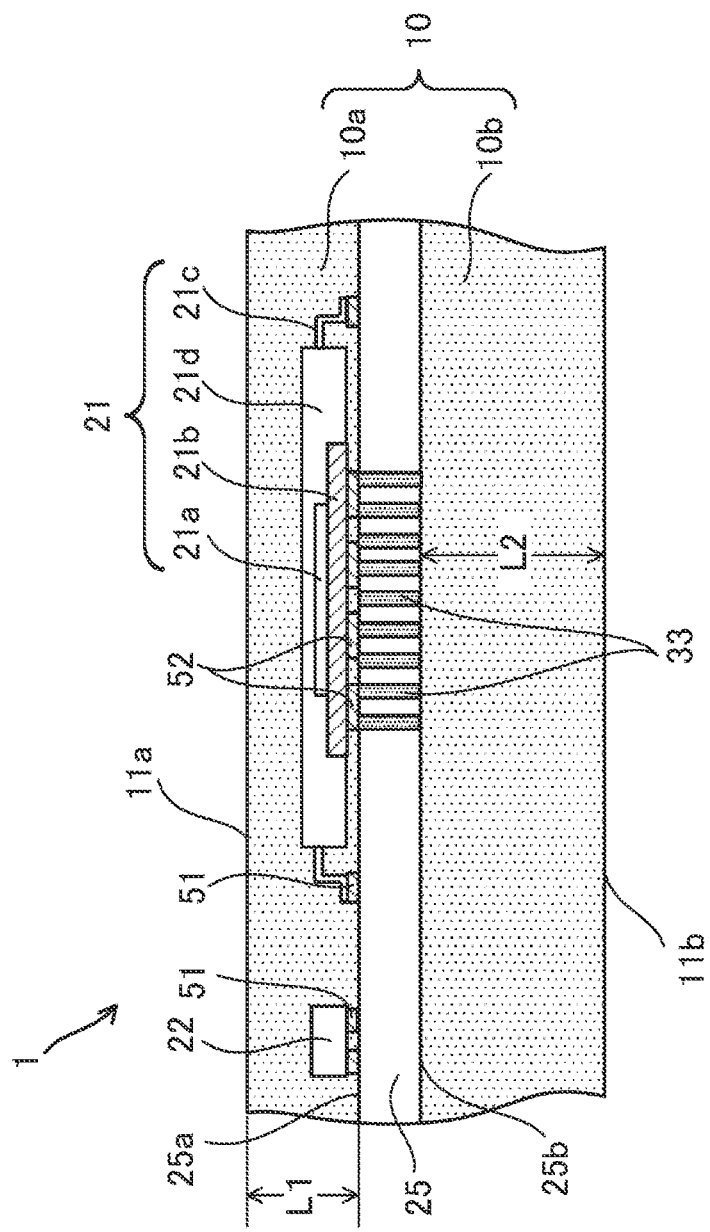
FIG. 2 is an enlarged view of a first electronic component, and a second electronic component peripheral edge section of the electronic control unit illustrated in FIG. 1.

FIG. 2 is an enlarged view of the first electronic component, and the second electronic component peripheral edge section of the electronic control unit illustrated in FIG. 1. Note that FIG. 2 illustrates a vertically reversed state relative to FIG. 1.

The first electronic component 21 includes: a semiconductor element 21a; a heat spreader 21b thermally coupled to the semiconductor element 21a; a sealing member 21d that seals in the semiconductor element 21a, and the heat spreader 21b; and a plurality of lead terminals 21c that are connected to the semiconductor element 21a, and extend out of the sealing member 21d. One surface of the heat spreader 21b that is opposite to the semiconductor element 21a is exposed through the sealing member 21d.

A thermally conductive material 52 is interposed between the one surface of the heat spreader 21b that is exposed through the sealing member 21d, and the first surface 25a of the wiring substrate 25. The thermally conductive material 52 is formed of a solder not containing lead such as Sn—Ag—Cu, or an electrically conductive resin such as a silver paste, for example. The thermally conductive material 52 couples the one surface of the heat spreader 21b and the vias 33 such that heat can be transferred therethrough. Stated differently, the thermally conductive material 52 thermally couples the one surface of the heat spreader 21b and the vias 33. Thereby, heat generated from the first semiconductor element 21a is transferred toward the first surface 25a of the wiring substrate 25 via the heat spreader 21b. In addition, heat transferred toward the first surface 25a of the wiring substrate 25 is transferred toward the second surface 25b of the wiring substrate 25 via the vias 33.

Heat transferred toward the first surface 25a of the wiring substrate 25 is mainly released outside via a resin 10a formed on the side where the first electronic component 21 is implemented. Heat transferred toward the second surface 25b of the wiring substrate 25 is mainly released outside via a resin 10b formed on the side opposite to the side where the first electronic component 21 is implemented.

In the first embodiment of the present invention, as illustrated in FIG. 2, a distance L2 between an outer surface 11b of the resin 10b immediately below the first electronic component 21, and the second surface 25b of the wiring substrate 25 is made longer than a distance L1 between an outer surface 11a of the resin 10a immediately above the second electronic component 22, and the first surface 25a of the wiring substrate 25. With this configuration, as illustrated in each example mentioned below, as compared with the structure in which the distance L2 between the outer surface 11b of the resin 10b immediately below the first electronic component 21, and the second surface 25b of the wiring substrate 25 is the same as or shorter than the distance L1 between the outer surface 11a of the resin 10a immediately above the second electronic component 22, and the first surface 25a of the wiring substrate 25, the heat dissipation property is increased.

Figure 3:
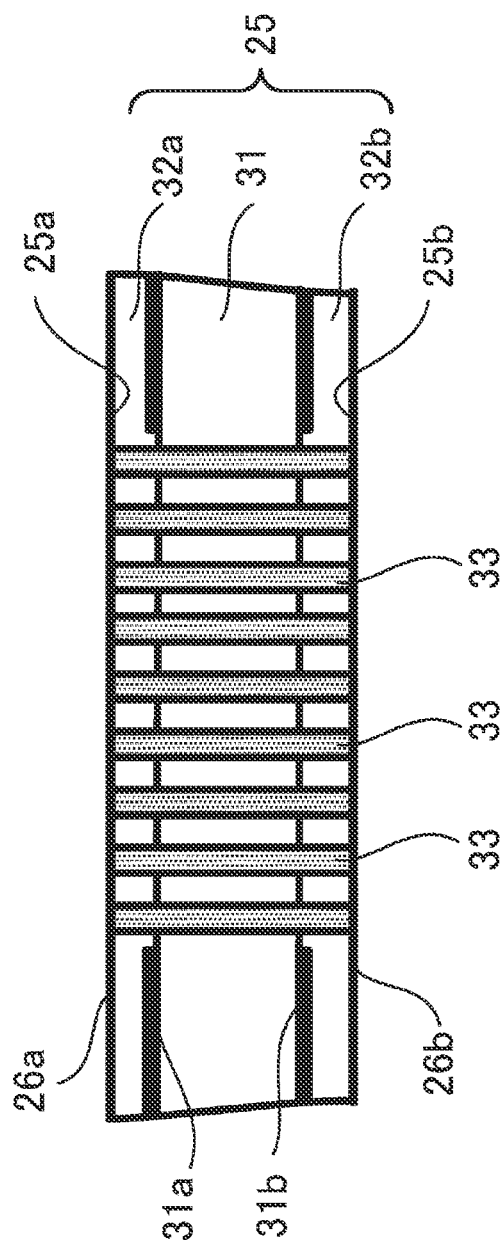
FIG. 3 is an enlarged view of a via formation area of a wiring substrate illustrated in FIG. 1.

FIG. 3 is an enlarged cross-sectional view of a via formation area of the wiring substrate illustrated in FIG. 1.

The wiring substrate 25 is formed by adhering prepregs 32a and 32b on upper and lower surfaces of a core member 31 on which inner layer conductors 31a and 31b are formed. The conductor wires 26a and 26b are formed on the outer surfaces of the prepregs 32a and 32b, respectively. The inner layer conductors 31a and 31b are formed thicker than the conductor wires 26a and 26b. The inner layer conductors 31a and 31b are not formed in an area where the vias 33 are formed. The vias 33 are formed by forming a plurality of through-holes that penetrate the core member 31 and the prepreg 32a and 32b by drilling or the like in the area where the inner layer conductors 31a and 31b are not formed, and forming a plated layer of copper or the like on the inner surface of each through-hole, or filling the inside of each through-hole with an electrically conductive material.

Heat generated by the first electronic component 21 is transferred to the inner layer conductors 31a and 31b via the first surface 25a of the wiring substrate 25 and the vias 33, and is transferred efficiently in the plane direction of the wiring substrate 25 by the inner layer conductors 31a and 31b. Then, the heat is transferred to the resins 10a and 10b from the first surface 25a, and second surface 25b of the wiring substrate 25.

Because of this, the heat dissipation property can be improved by increasing the thicknesses of the inner layer conductors 31a and 31b. By making the thicknesses of the inner layer conductors 31a and 31b greater than the thicknesses of the conductor wires 26a and 26b formed on the outer surface of the wiring substrate 25, the wiring substrate 25 with a good heat dissipation property can be obtained at low costs. In addition, the heat dissipation property can be improved by increasing the number of the vias 33.

Next, a method of manufacturing the electronic control unit 1 illustrated in FIG. 1 is illustrated.

The wiring substrate 25 having the conductor wires 26a and 26b, the vias 33, and the inner layer conductors 31a and 31b are formed in advance.

For the formation of the wiring substrate 25, the electrically conductive material 51, and the thermally conductive material 52 are supplied onto a connection pad (not illustrated) of the conductor wire 26a formed on the first surface 25a of the wiring substrate 25. Then, the first electronic component 21, and the second electronic component 22 are mounted on the electrically conductive material 51. The first electronic component 21 is mounted such that the heat spreader 21b contacts the thermally conductive material 52. The electrically conductive material 51, and the thermally conductive material 52 may be the same material. In this state, the electrically conductive material 51, and the thermally conductive material 52 are melted and solidified by reflowing or the like, and the first electronic component 21, and the second electronic component 22 are electrically connected to the conductor wire 26a. Similar steps are performed also on the side of the second surface 25b of the wiring substrate 25, and the third electronic component 23 is electrically connected to the conductor wire 26b by the electrically conductive material 51.

Next, one end of each connector terminal 41a of the connector 41 is inserted into a through-hole of the wiring substrate 25, and connected to the conductor wires 26a and 26b of the wiring substrate 25 by a joint material such as a solder which is not illustrated. In this manner, the electronic component constituent body 20 having the wiring substrate 25, the first electronic component 21, the second electronic component 22, the third electronic component 23, and the connector 41 is formed.

Thereafter, the electronic component constituent body 20 is housed in a mold, a fluid resin composition is injected into the mold, and the resin 10 to seal the entire electronic component constituent body 20 is formed by molding.

With such steps, the electronic control unit 1 illustrated in FIG. 1 is fabricated.

First Example

An ASIC including a lead-shaped terminal is used as the first electronic component 21, and a chip resistor with the size of 1.6-mm×0.8-mm is used as the second electronic component 22. A solder made of Sn-3Ag-0.5Cu, and not containing lead is used as the electrically conductive material 51, and the thermally conductive material 52. The lead terminal 21c, and the second electronic component 22 are electrically connected to the first surface 25a of the wiring substrate 25 by the electrically conductive material 51. In addition, the heat spreader 21b of the first electronic component 21, and the vias 33 are thermally coupled by the thermally conductive material 52. The area of the heat spreader 21b is 8-mm×8-mm square, and the area of the sealing member 21d of the first electronic component 21 is 14-mm×14-mm square. A multi-layer wiring substrate including 76-mm×76-mm square four layer wires with thickness of 1.6 mm is used as the wiring substrate 25.

The vias 33 are formed on the wiring substrate 25 immediately below the heat spreader 21b. The resin 10 is a 80-mm×80-mm square resin, the distance L2 between the outer surface 11b of the resin 10b immediately below the first electronic component 21, and the second surface 25b of the wiring substrate 25 is 10 mm, and the distance L1 between the outer surface 11a of the resin 10a immediately above the second electronic component 22, and the first surface 25a of the wiring substrate 25 is 3 mm.

An electronic control unit of a first comparative example is fabricated, apart from the first example described above.

Figure 4:
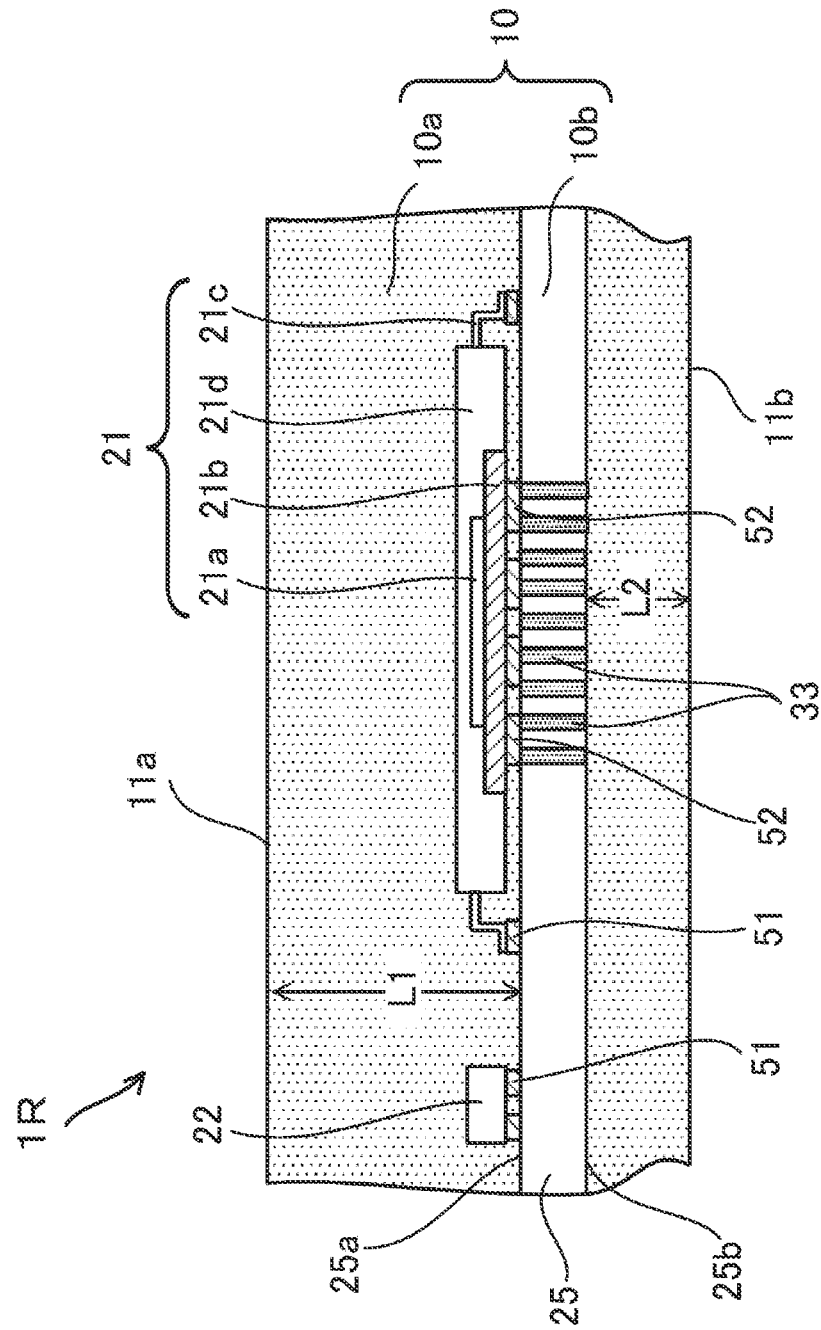
FIG. 4 is a cross-sectional view of an electronic control unit according to a first comparative example, and is a figure corresponding to FIG. 2 illustrating the first embodiment of the present invention.

FIG. 4 is a cross-sectional view of the electronic control unit according to the first comparative example, and is a figure corresponding to FIG. 2 illustrating the first embodiment of the present invention.

An electronic control unit 1R of the first comparative example is formed such that the distance L2 between the outer surface 11b of the resin 10b immediately below the first electronic component 21, and the second surface 25b of the wiring substrate 25 is shorter than the distance L1 between the outer surface 11a of the resin 10a immediately above the second electronic component 22, and the first surface 25a of the wiring substrate 25.

As the first comparative example, the distance L2 (hereinafter, simply referred to as the "distance L2" in some cases) between the outer surface 11b of the resin 10b immediately below the first electronic component 21, and the second surface 25b of the wiring substrate 25 is set to 3 mm, and the distance L1 (hereinafter, simply referred to as the "distance L1" in some cases) between the outer surface 11a of the resin 10a immediately above the second electronic component 22, and the first surface 25a of the wiring substrate 25 is set to 10 mm.

In addition, a reference component is fabricated, apart from the electronic control unit 1 of the first example, and the electronic control unit 1R of the first comparative example. The reference component has the same configuration as the electronic control unit 1 of the first example other than that the distance L2 is 3 mm, and the distance L1 is 3 mm.

Figure 5:
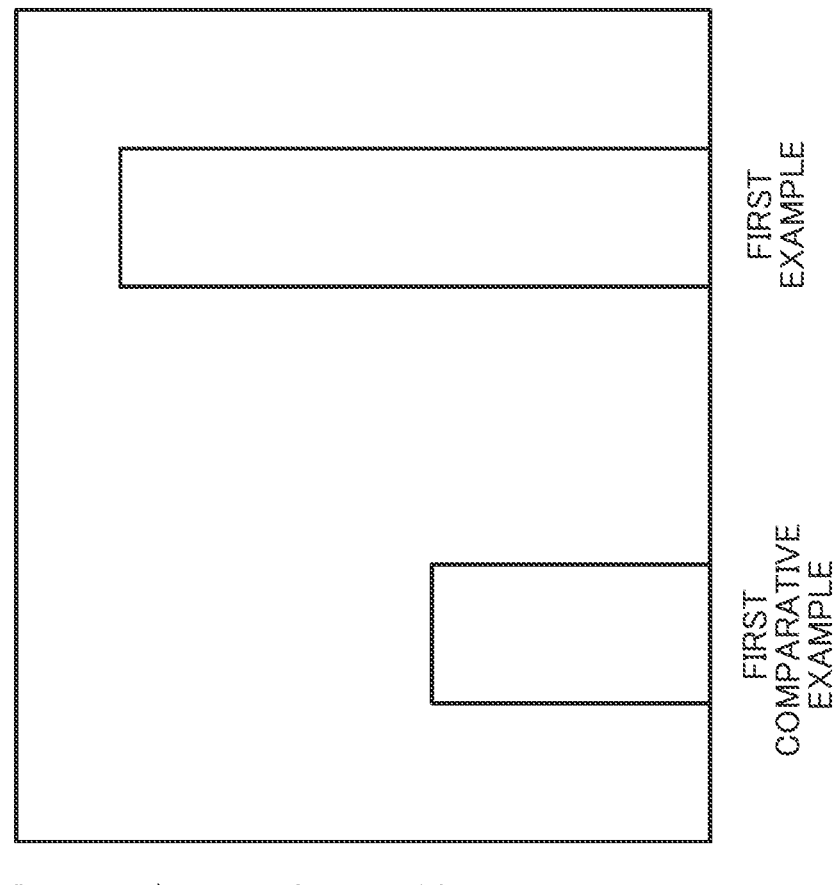
FIG. 5 is a figure illustrating a temperature decrease amount a temperature decrease amount of the first comparative example, and the first embodiment of the present invention relative to a reference component of the first electronic component.

FIG. 5 is a figure illustrating temperature decrease amounts of the first electronic component according to the first comparative example, and the first embodiment of the present invention relative to the reference component.

Regarding the electronic control unit 1 of the first example, the electronic control unit 1R of the first comparative example, and the reference component, the temperature of the semiconductor element 21a in a case that the semiconductor element 21a is caused to generate 3 W of heat was measured. The measurement is performed in an environment where the electronic control units 1 and 1R, and the reference component are arranged in a wind tunnel with the air in a windless state (windspeed: 0 m/s) at temperature of 105° C.

As illustrated in FIG. 5, regarding the first example, a "temperature decrease amount of the first electronic component relative to the reference component" is approximately 4° C. In addition, regarding the first comparative example, a "temperature decrease amount of the first electronic component relative to the reference component" is approximately 2° C. Accordingly, the "temperature decrease amount of the first electronic component relative to the reference component" of the first example is approximately 2° C. greater than the "temperature decrease amount of the first electronic component relative to the reference component" of the first comparative example. Thereby, it has been confirmed that the electronic control unit 1 of the first embodiment has a better heat dissipation property about heat generated by the semiconductor element 21a than the electronic control unit 1R of the first comparative example, and can suppress the temperature increase of the electronic control unit 1.

Note that as illustrated in FIG. 1, and FIG. 2, in the structure illustrated as an example in the first embodiment, the outer surface 11a of the resin 10a is flat, that is, the thickness of the resin 10a formed on the first surface 25a of the wiring substrate 25 is uniform over the entire surface. Stated differently, the distance between the outer surface 11a of the resin 10a immediately above the first electronic component 21, and the first surface 25a of the wiring substrate 25 is L1, which is the same as the distance between the outer surface 11a of the resin 10a immediately above the second electronic component 22, and the first surface 25a of the wiring substrate 25. However, because the resin 10a has a thermal conductivity greater than that of air, as the thickness of the resin 10a increases, the degree of improvement of the heat dissipation property about heat generated by the first electronic component 2 increases. Because of this, the distance between the outer surface 11a of the resin 10a immediately above the first electronic component 21, and the first surface 25a of the wiring substrate 25 may be made longer than the distance L1. That is, an electronic control unit 1 with a good heat dissipation property, and with a reduced amount of the resin 10a can be obtained if the electronic control unit 1 has a structure in which the distance L2 between the outer surface 11b of the resin 10b immediately below the first electronic component 21, and the second surface 25b of the wiring substrate 25 is longer than the distance L1 between the outer surface 11a of the resin 10a immediately above the second electronic component 22, and the first surface 25a of the wiring substrate 25.

The first embodiment of the present invention provides advantages described below.

(1) The electronic control unit 1 includes the first surface 25a of the wiring substrate 25 on which the first electronic component 21 having a large heat generation amount, and the second electronic component 22 having a heat generation amount smaller than that of the first electronic component 21 are implemented, and the electronic control unit 1 includes the resin 10 that covers the first and second electronic components 21 and 22, and the wiring substrate 25. The distance L2 between the outer surface 11b of the resin 10b immediately below the first electronic component 21, and the second surface 25b of the wiring substrate 25 is longer than the distance L1 between the outer surface 11a of the resin 10a immediately above the second electronic component 22, and the first surface 25a of the wiring substrate 25. Because of this, the heat dissipation property about heat generated by the first electronic component 21 can be improved, and the amount of the resin 10a can be reduced.

Because the electronic control unit 1 of the first embodiment can have an improved heat dissipation property, it can be formed as the electronic control unit 1 for which a heat sink, a heat dissipation case or the like having a cooling section such as a heat dissipation fin is not used. If it can be formed as the electronic control unit 1 for which a heat sink or a heat dissipation case is not used, it is possible to attempt to reduce the size and costs. Note that the present invention is not limited to the electronic control unit 1 for which a heat sink, a heat dissipation case or the like is not used, but the present invention also includes an electronic control unit 1 including a heat sink, a heat dissipation case or the like.

Note that in the description above, the thickness of the resin 10a covering the first surface 25a of the wiring substrate 25 can be made the same in an area covering immediately above the first electronic component 21, and an area covering immediately above the second electronic component 22. In summary, the outer surface 11a of the resin 10a covering the first surface 25a of the wiring substrate 25 can be made flat. Thereby, deformation of the wiring substrate 25 can be suppressed, and the production efficiency can be improved.

(2) The wiring substrate 25 has the vias 33 that thermally couple the first surface 25a, and the second surface 25b. Because of this, the thermal conduction property from the side of the first surface 25a to the side of the second surface 25b in the wiring substrate 25 can be improved, and the heat dissipation property can be improved further.

(3) The wiring substrate 25 is a multilayer lamination substrate having the inner layer conductors 31a and 31b, and the thicknesses of the inner layer conductors 31a and 31b are greater than the thicknesses of the conductor wires 26a and 26b formed on the first surface of the wiring substrate 25. Because the inner layer conductors 31a and 31b are thick, heat generated by the first electronic component 21 is transferred efficiently in the plane direction of the wiring substrate 25 via the inner layer conductors 31a and 31b, and the heat dissipation property improves.

(4) The first electronic component 21 has the semiconductor element 21a, the heat spreader 21b thermally coupled to the semiconductor element 21a, and the sealing member 21d, and the one surface of the heat spreader 21b opposite to the semiconductor element 21a is exposed through the sealing member 21d. Because of this, heat generated by the semiconductor element 21a can be dissipated efficiently from the heat spreader 21b.

(5) The thermally conductive material 52 that thermally couples the heat spreader 21b, and the conductor wires 26a and 26b of the wiring substrate 25 is further included. Because of this, heat generated by the first electronic component 21 can be transferred efficiently from the thermally conductive material 52 to the wiring substrate 25, and the heat dissipation property can be improved.

Second Embodiment

Figure 6:
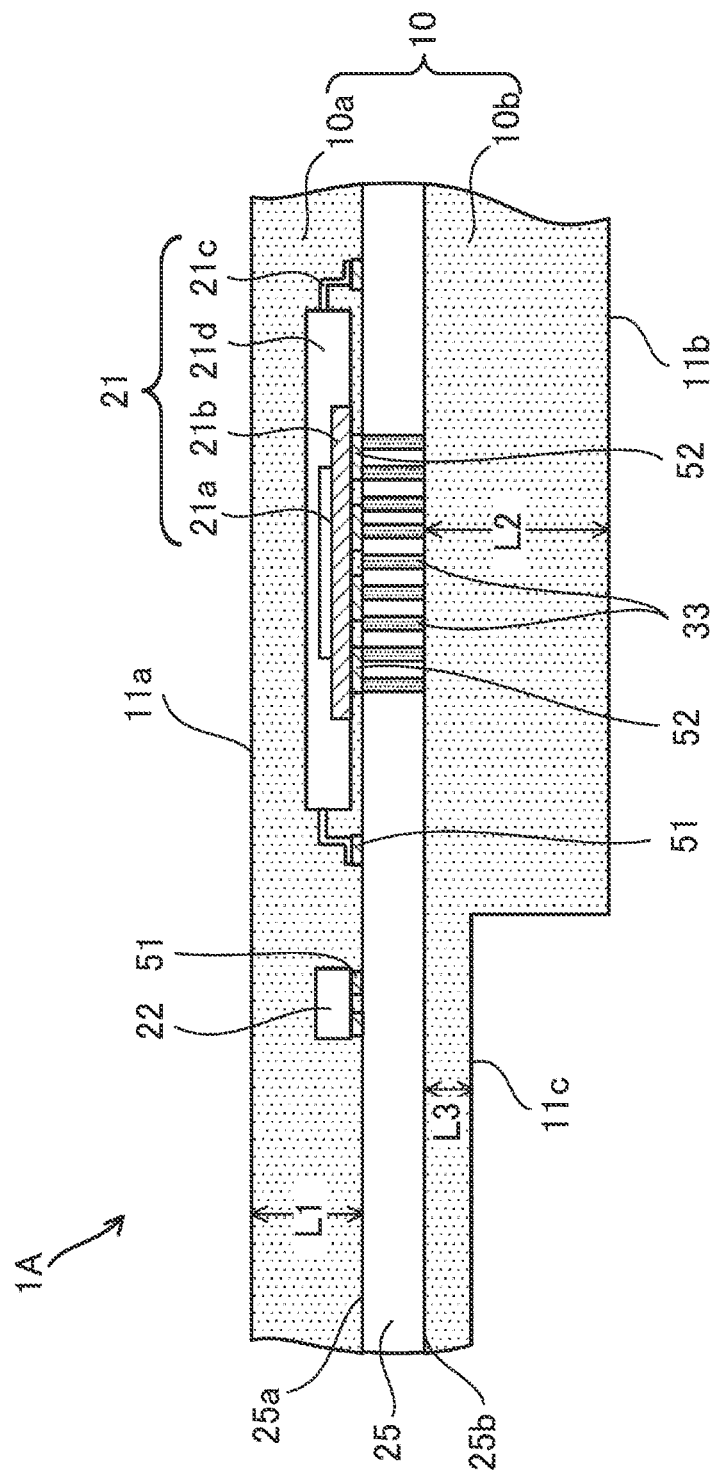
FIG. 6 is a cross-sectional view illustrating of a second embodiment of the electronic control unit according to the present invention, and corresponding to FIG. 2 illustrating the first embodiment.

FIG. 6 is a cross-sectional view illustrating of a second embodiment of the electronic control unit according to the present invention, and corresponding to FIG. 2 illustrating the first embodiment.

In the second embodiment, a distance L3 (hereinafter, simply referred to as the "distance L3" in some cases) between an outer surface 11c of the resin 10b immediately below the second electronic component 22, and the second surface 25b of the wiring substrate 25 is shorter than, than the distance L2 between the outer surface 11b of the resin 10b immediately below the first electronic component 21, and the second surface 25b of the wiring substrate 25.

Because the second electronic component 22 has a heat generation amount smaller than that of the first electronic component 21, a structure that can reduce the heat dissipation amount near an area where the second electronic component 22 is implemented can be realized. By making the thickness of the resin 10b of the area covering the second surface 25b of the wiring substrate 25 immediately below the second electronic component 22 smaller than the thickness of the resin 10b of the area covering the second surface 25b of the wiring substrate 25 immediately below the first electronic component 21, the amount of the resin 10b can be reduced, and the cost can be reduced.

Second Example

As illustrated FIG. 6, an electronic control unit 1A of the second example having the same configuration as that of the first example other than that the distance L3 is shorter than the distance L2 was fabricated.

Then, under the conditions described about the first example, temperature decrease amounts of the second example and the first comparative example relative to the reference component were compared.

Figure 7:
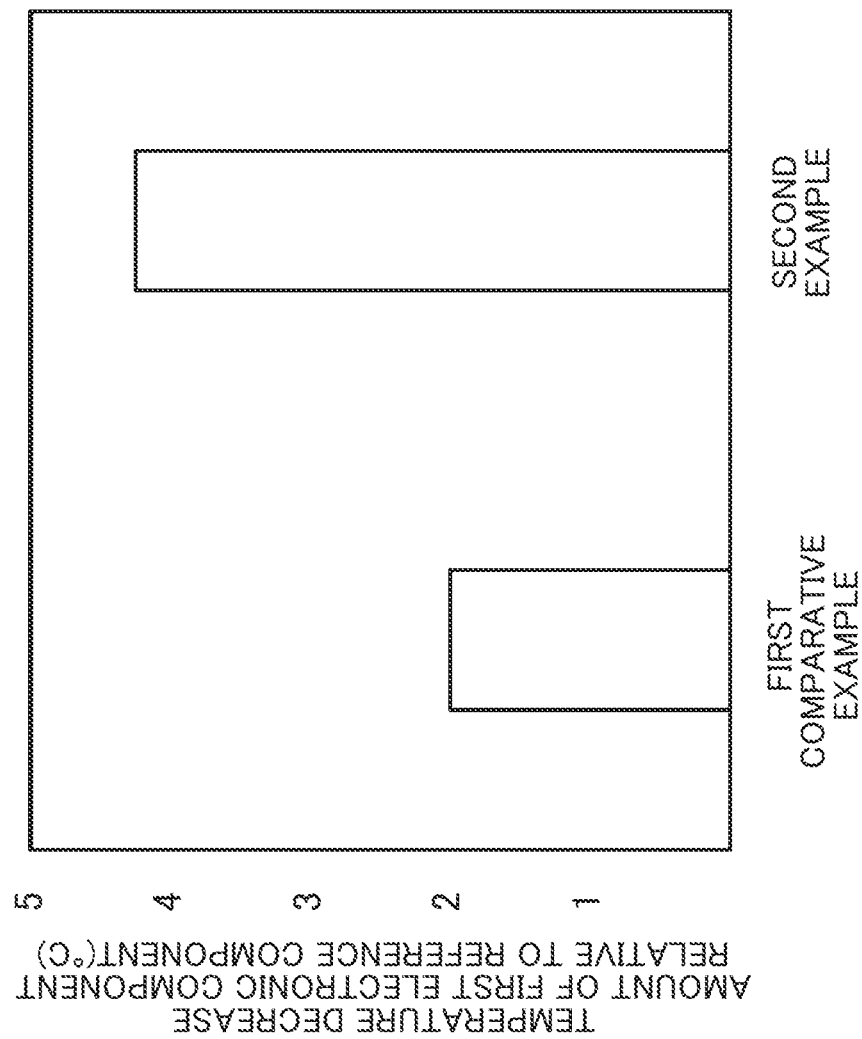
FIG. 7 is a figure illustrating temperature decrease amounts temperature decrease amounts of the first electronic component according to the first comparative example, and the second example relative to the reference component.

FIG. 7 is a figure illustrating temperature decrease amounts temperature decrease amounts of the first electronic component according to the first comparative example, and the second example relative to the reference component.

As illustrated in FIG. 7, the "temperature decrease amount of the first electronic component relative to the reference component" of the second example is approximately 2° C. greater than the "temperature decrease amount of the first electronic component relative to the reference component" of the first comparative example. That is, it has been confirmed that the second example also has a high heat dissipation property similarly to the first example.

The configuration of the second embodiment is similar to that of the first embodiment in other respects. Accordingly, the advantages (1) to (5) similar to those of the first embodiment can be attained also in the second embodiment.

Third Embodiment

Figure 8:
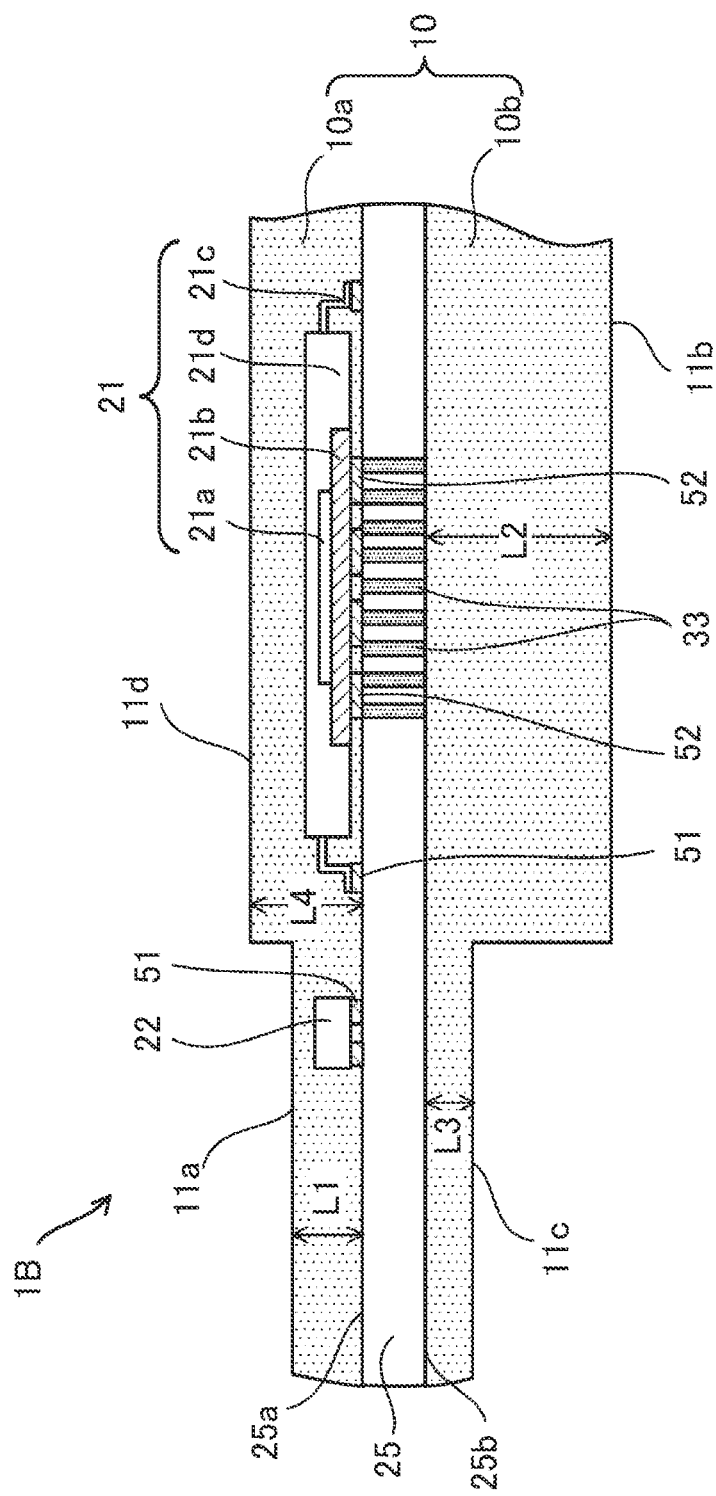
FIG. 8 is a cross-sectional view illustrating of a third embodiment of the electronic control unit according to the present invention, and corresponding to FIG. 2 illustrating the first embodiment.

FIG. 8 is a cross-sectional view illustrating of a third embodiment of an electronic control unit 1B according to the present invention, and corresponding to FIG. 2 illustrating the first embodiment.

In the third embodiment, in addition to the structure of the second embodiment, a distance L4 (hereinafter, simply referred to as the "distance L4" in some cases) between an outer surface 11d of the resin 10a immediately above the first electronic component 21, and the first surface 25a of the wiring substrate 25 is made longer than the distance L1 between the outer surface 11a of the resin 10a immediately above the second electronic component 22, and the first surface 25a of the wiring substrate 25.

That is, in the third embodiment, the distance L3 is shorter than the distance L2, and the distance L4 is longer than the distance L1.

As explained in the first embodiment, as the thickness of the resin 10a of the area formed immediately above the first electronic component 21 increases, the degree of improvement of the heat dissipation property about heat generated by the first electronic component 21 increases. Because the first electronic component 21 has a large heat generation amount, by increasing the thickness of the resin 10a formed in the area immediately above the first electronic component 21, it is possible to further improve the heat dissipation property, reduce the amount of the resin 10a, and reduce the cost.

Third Example

As illustrated FIG. 8, an electronic control unit of the third example having the same configuration as that of the second example other than that the distance L4 is longer than the distance L1 was fabricated.

Then, under the conditions described about the first example, temperature decrease amounts of the third example and the first comparative example relative to the reference component were compared.

FIG. 9 is a figure illustrating a temperature decrease amount temperature decrease amount of the first electronic component according to the first comparative example, and the third example relative to the reference component.

As illustrated in FIG. 9, the "temperature decrease amount of the first electronic component relative to the reference component" of the third example is approximately 2° C. greater than the "temperature decrease amount of the first electronic component relative to the reference component" of the first comparative example. That is, it has been confirmed that the third example also has a high heat dissipation property similarly to the first example.

The configuration of the third embodiment is similar to that of the first embodiment in other respects. Accordingly, the advantages (1) to (5) similar to those of the first embodiment can be attained also in the third embodiment.

Note that similarly to the first embodiment, the distance L2 and the distance L3 may be made the same in the third embodiment.

In each embodiment described above, an electric control unit including one first electronic component 21 having a large heat generation amount is illustrated as an example of the electronic control unit 1, 1A or 1B. However, it is also possible to apply the present invention to an electronic control unit including a plurality of first electronic components 21.

Although various embodiments and modification examples are explained above, the present invention is not limited to the contents of them. Other aspects that are conceivable within the scope of the technical idea of the present invention are also included in the scope of the present invention.

The disclosed content of the following priority application is incorporated herein as a reference.

Japanese Patent Application No. 2018-176199 (filed on Sep. 20, 2018)

LIST OF REFERENCE SIGNS 1, 1A, 1B: electronic control unit
10, 10a, 10b: resin
11a, 11b, 11c, 11d: outer surface
21: first electronic component
21a: semiconductor element
21b: heat spreader
21d: sealing member
22: second electronic component
25: wiring substrate
25a: first surface
25b: second surface
26a, 26b: conductor wire
31: core member
31a, 31b: inner layer conductor
33: via
51: electrically conductive material
52: thermally conductive material
L1: distance between the outer surface of the resin immediately above the second electronic component, and the first surface of the wiring substrate
L2: distance between the outer surface of the resin immediately below the first electronic component, and the second surface of the wiring substrate
L3: distance between the outer surface of the resin immediately below the second electronic component, and the second surface of the wiring substrate
L4: distance between the outer surface of the resin immediately above the first electronic component, and the first surface of the wiring substrate

The invention claimed is:

1. An electronic control unit comprising:
a wiring substrate having a first surface on which a conductor wire is formed;
a first electronic component that is implemented on the first surface of the wiring substrate, and has a large heat generation amount;
a second electronic component that is implemented on the first surface of the wiring substrate, and has a heat generation amount smaller than the first electronic component; and
a resin that covers the first electronic component, the second electronic component, and the first surface of the wiring substrate, and a second surface of the wiring substrate that is opposite to the first surface, wherein
a distance between an outer surface of the resin immediately below the first electronic component, and the second surface of the wiring substrate is longer than a distance between an outer surface of the resin immediately above the second electronic component, and the first surface of the wiring substrate.

2. The electronic control unit according to claim 1, wherein a distance between an outer surface of the resin immediately above the first electronic component, and the first surface of the wiring substrate is the same as a distance between the outer surface of the resin immediately above the second electronic component, and the first surface of the wiring substrate.

3. The electronic control unit according to claim 1, wherein a distance between an outer surface of the resin immediately below the second electronic component, and the second surface of the wiring substrate is shorter than a distance between the outer surface of the resin immediately below the first electronic component, and the second surface of the wiring substrate.

4. The electronic control unit according to claim 1, wherein a distance between an outer surface of the resin immediately above the first electronic component, and the first surface of the wiring substrate is longer than a distance between the outer surface of the resin immediately above the second electronic component, and the first surface of the wiring substrate.

5. The electronic control unit according to claim 4, wherein a distance between an outer surface of the resin immediately below the second electronic component, and the second surface of the wiring substrate is shorter than a distance between an outer surface of the resin immediately below the first electronic component, and the second surface of the wiring substrate.

6. The electronic control unit according to claim 1, wherein the wiring substrate has a via that thermally couples the first surface and the second surface.

7. The electronic control unit according to claim 1, wherein
the wiring substrate is a multilayer lamination substrate having an inner layer conductor, and
a thickness of the inner layer conductor is greater than the conductor wire formed on the first surface of the wiring substrate.

8. The electronic control unit according to claim 1, wherein
the first electronic component has a semiconductor element, a heat spreader that is thermally coupled to the semiconductor element, and a sealing member, and
one surface of the heat spreader opposite to the semiconductor element is exposed through the sealing member.

9. The electronic control unit according to claim 8, further comprising a thermally conductive material that thermally couples the heat spreader, and the conductor wire of the wiring substrate.

10. The electronic control unit according to claim 1, wherein
the wiring substrate has a via that thermally couples the first surface and the second surface,
the wiring substrate is a multilayer lamination substrate having an inner layer conductor thicker than the conductor wire formed on the first surface of the wiring substrate, and
the electronic control unit further comprises a thermally conductive material that thermally couples the second electronic component and the conductor wire of the wiring substrate.

11. The electronic control unit according to claim 1, wherein a distance between an outer surface of the resin immediately above the first electronic component, and the first surface of the wiring substrate is shorter than a distance between an outer surface of the resin immediately below the first electronic component, and the second surface of the wiring substrate.

* * * * *